(12) United States Patent
Cox et al.

(10) Patent No.: US 6,583,679 B1
(45) Date of Patent: Jun. 24, 2003

(54) HIGH-EFFICIENCY HIGH-POWER AMPLIFIER

(75) Inventors: Donald C. Cox, Stanford, CA (US); Mehdi F. Soltan, Stanford, CA (US); Thomas H. Lee, Cupertino, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/893,917

(22) Filed: Jun. 28, 2001

(51) Int. Cl.[7] .............................. H03C 1/00; H03F 3/38
(52) U.S. Cl. ..................... 332/149; 332/151; 330/10
(58) Field of Search ......................... 332/149, 151–153, 332/183, 184; 330/10; 341/143

(56) References Cited

U.S. PATENT DOCUMENTS 5,249,201 A * 9/1993 Posner et al. ................. 375/59

OTHER PUBLICATIONS

"Switched–Current Sigma–Delta Modulation ofr A/D Conversion", Philip J. Crawley and Gordon W. Roberts, *EE department, McGill University*, pp. 1320–1323, 1992.

* cited by examiner

*Primary Examiner*—David C. Mis
(74) *Attorney, Agent, or Firm*—Parsons Hsue & De Runtz, LLP.

(57) ABSTRACT

An inexpensive method and means for generating high power envelope-modulated radio frequency signals is disclosed. Embodiments provide EER amplification and separate modulation of information encoded as phase angle and as amplitude. An envelope modulated signal generation apparatus comprising a source of carrier signal, a source of a binary data stream, a pulse deletion logic and a current switch is disclosed.

15 Claims, 5 Drawing Sheets

HIGH-EFFICIENCY HIGH-POWER AMPLIFIER

BACKGROUND AND DESCRIPTION OF PRIOR ART

Power efficiency is important in high power radio frequency (RF) amplifiers especially for reasons of thermal management and, typically in portable equipment, battery life.

In high power RF amplifiers it is common to use highly non-linear amplifiers in order to achieve efficiency. Such power amplifiers (PA) are commonly termed output stages. In simple terms, if an active device used in an output stage is operated in a linear region then it may have significant heat dissipation and hence relatively poor efficiency and resultant thermal issues. Conversely, if the active device is used essentially as a binary (two-state) switch then it dissipates little power in either on or off state and the only significant power consumption occurs during transitional periods between states. Good efficiency thus dictates fast switching. Energy recovery circuits are used to provide waveform shaping for spectral purity while maintaining efficiency according to well known techniques such as the simple and effective tank circuits used since the early days of vacuum tube amplifiers.

As is well known, the use of non-linear amplifiers works well with constant envelope modulation techniques such as frequency shift keying (FSK), frequency modulation (FM) and other forms of angle modulation.

The use of non-linear active devices for envelope-modulation signals such as amplitude modulation (AM), quadrature AM (QAM), or single sideband AM (SSB) is not so straightforward. Techniques such as corrective and adaptive pre-distortion, feedforward linearization, envelope elimination and restoration (EER) using the Kahn technique, linear amplification with non-linear components (LINC), and Cartesian feedback are each successful but are typically complex and expensive. In previous implementations for consumer grade (i.e. inexpensive) products, overall linearity has been achieved by sacrificing energy efficiency and biasing active devices into a linear region to build linear amplifiers.

Thus, a need exists for an inexpensive method or means for generating high power envelope-modulated radio frequency signals.

SUMMARY OF THE INVENTION

Accordingly, the invention presents an inexpensive method and means for generating high power envelope-modulated radio frequency signals.

According to an embodiment of the invention an analog signal, which may be a baseband signal, becomes envelope-modulated upon a high power RF carrier. Further, the creation of envelope modulation by pulse deletion may be impressed, not merely onto a pure carrier, but upon an RF signal that may be modulated with an essentially constant envelope form of modulation. For example, envelope modulation by pulse deletion may be applied to a signal containing angle modulation such as quadrature phase shift keying (QPSK). Thus a separate and additional channel of information may be passed as envelope modulation through a system that formerly carried only angle modulation signals without material degradation of those angle modulated signals.

According to a still further aspect of the invention, control signal may be derived by recovery from a low-level envelope modulated RF signal. Thus, inventive output stages may be fed by a demodulator or similar to create an EER amplifier system. Such an EER amplifier system may, but need not, provide for envelope feedback control.

DESCRIPTION OF DRAWINGS

FIG. 3b shows some waveforms of signals present in the circuit of FIG. 3a.

For simplicity in description, identical components are labeled by the same numerals in this application.

DETAILED DESCRIPTION OF PREFERRED EMBODIMENTS

Figure 1:
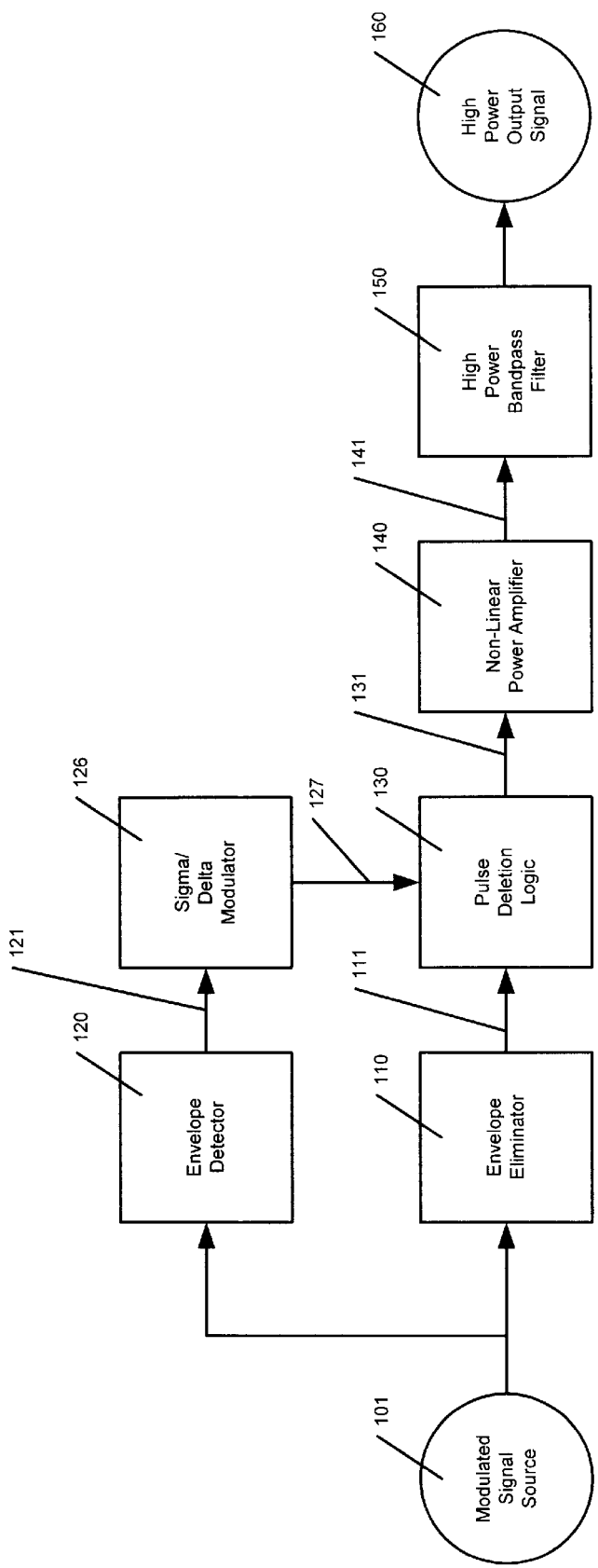
FIG. 1 shows a block diagram of a power amplifier using EER according to an embodiment of the invention.

According to an aspect of the present invention, an output stage may comprise an active switching device used as a class D RF amplifier. A low-level RF signal in the form of a train of pulses may feed a control terminal of the active device. The low-level RF signal may be, loosely speaking, a clipped waveform swinging between an earthy potential and a substantially constant positive voltage, though this is not a critical feature. Such signals may be generated by high-speed digital logic gates or otherwise by techniques well known in the art. The low-level RF input signal can be gated with a control signal derived from digitization of the baseband analog signal. The control signal, when activated, may cause a pulse (or a number of pulses) to be deleted from the low level RF input signal. An effect of deleting pulses from the low-level RF input signal is to reduce the overall amplitude (and hence envelope power) of the high power RF signal generated at the output stage. Peak envelope power (PEP) may, however, be relatively unaffected. To a reasonable approximation the average envelope will be reduced in proportion to the percentage of pulses deleted. The proportion of pulses deleted may typically be fairly small where an additional channel of data is being superimposed on a phase-modulated carrier that carries orthogonal data. Perhaps on the order of 1% of all pulses may be deleted in such a case, resulting in a lightly modulated carrier. Conversely a large proportion of pulses may be deleted to depress the carrier by as much as about 8 dB or roughly 80% of pulses. Typically the bandwidth may be on the order of 1% of the carrier frequency so even if 80% of pulses were eliminated there would still be on the order of 20 pulses left per modulated phase state. The control signal may be derived by sampling the baseband analog signal according to conventional techniques, for example, pulse coded modulation (PCM) or Sigma-Delta modulation. Forms of Delta modulation have advantages of low cost and provide good price-performance trade-offs especially when deployed in lossy (as opposed to lossless) systems. Error containment due to errors due to imperfect signal recovery may be superior with Sigma-Delta modulation and inferior with PCM. Using single bit resolution Sigma-Delta modulation, the single bit oversampling rate might typically be on the order of 100:1. Thus, an example embodiment using a 1 GHz RF carrier might have a Sigma-Delta bit rate of 10 Mbit/sec (equivalent to 10 MHz with 2:1 allowed as an anti-aliasing margin) and an analog signal bandwidth of 100 kHz. Such a 100 kHz channel could typically support a single hi-fi channel or a few dozen toll grade voice channels. The ostensibly poor spectral efficiency of such an envelope—modulated signal may not be critical in all applications, especially when envelope modulation is combined with angle modulation.

Systems and apparatuses for developing high-power envelope modulated RF signals are disclosed. The RF signals may, but need not, contain information encoded as phase modulation (PM) or other forms of constant envelope modulation such as the various forms of angle modulation, for example FSK.

FIG. 1 shows a block diagram of a power amplifier using EER according to an embodiment of the invention. Referring to FIG. 1, a modulated RF signal source 101 containing both phase and amplitude information is split into two parts. Envelope detector 120 creates a first part-signal 121 containing only amplitude (envelope) information. Envelope detectors are sometimes termed envelope demodulators in the art. A second part-signal 111 containing only phase information and of substantially constant envelope is created by envelope eliminator 110. Envelope eliminator may, for example, be embodied as a simple transistor amplifier operating in a saturated region. Techniques for envelope detection and envelope elimination are well known in the art. The first part-signal is fed to Sigma-Delta modulator 126 which produces output signal 127. Sigma-Delta modulators are fairly well known in the art, see for example "Switched-Current Sigma-Delta modulation for A/D conversion" authors Crawley and Roberts, EE department, McGill University, 1992. Pulse deletion logic 130 eliminates half-cycles (pulses) from second part-signal 111 in response to Sigma-Delta output signal 127 to create pulse train 131. Pulse deletion logic may be embodied as described herein in connection with FIG. 3a or by other methods well known in the art. Pulse train 131 is fed to high power amplifier 140 which operates in a highly non-linear mode, essentially as an on/off switch to create high power signal 141. High power signal 141 is shaped by high power bandpass filter 150 to create high power output signal 160. High power bandpass filter 150 may be embodied as an energy recovery waveform shaping circuit as discussed herein in connection with FIG. 2 or otherwise.

Figure 2:
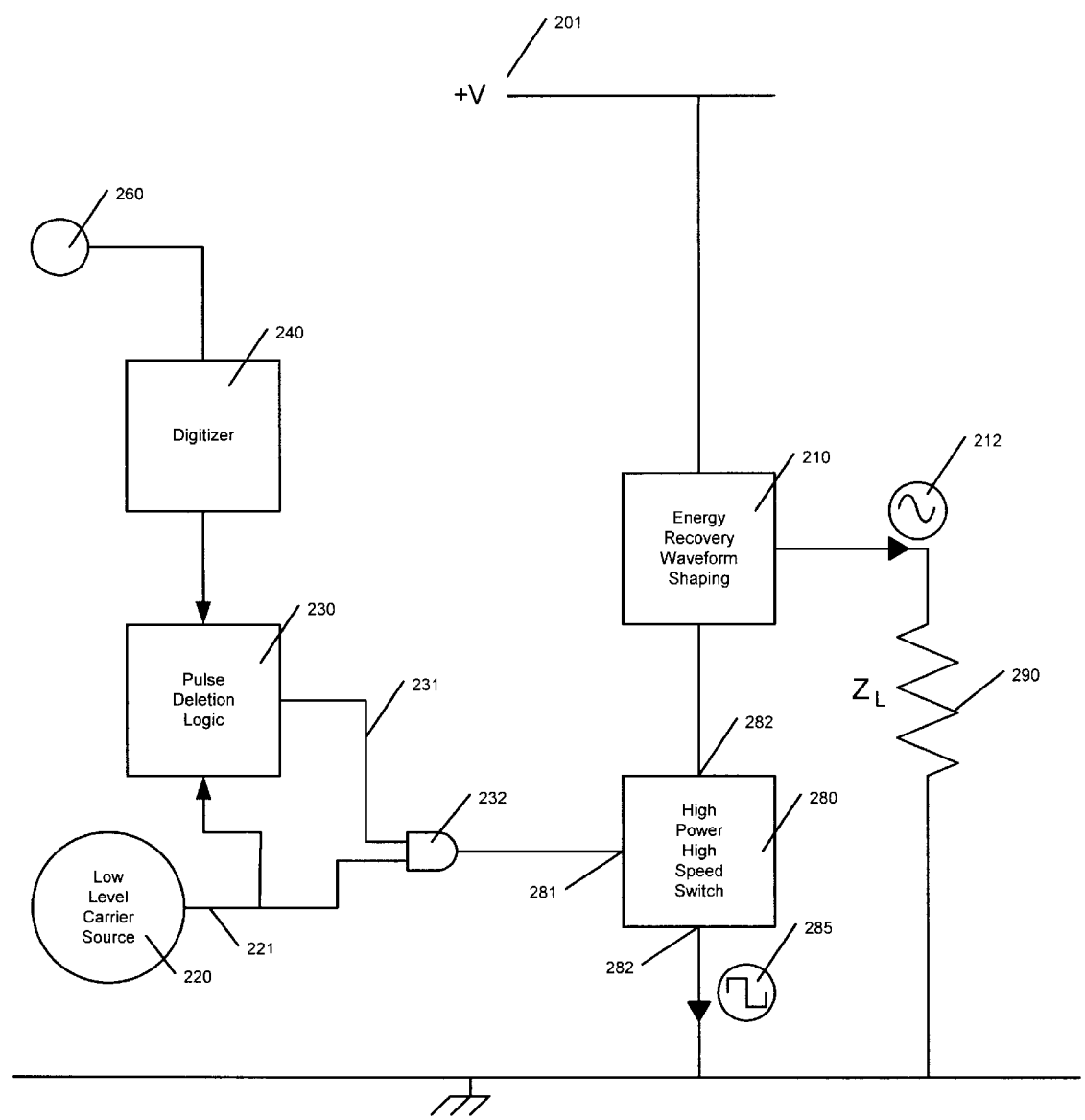
FIG. 2 shows a block diagram of high power amplifier-modulator according to an embodiment of the invention.

FIG. 2 shows a block diagram of high power amplifier-modulator according to an embodiment of the invention. Referring to FIG. 2, high-speed switching device 280 has two high current terminals 282 and a control terminal 281. High-speed switching device 280 may be embodied as any of a number of types of active devices, for example, as a GaAsFET (Gallium Arsenide Field-Effect Transistor). Under the direction of the signal at control terminal 281, high-speed switching device 280 turns on and off, passing alternately high current (sourced from power rail 201) and zero current, to produce a squarewave current 285. Energy recovery waveform shaping circuit 210, acts as a bandpass filter and may be a simple parallel Inductance-Capacitance "tank" circuit. Energy recovery waveform shaping circuit 210 provides for a well formed output waveform 212 into a substantially resistive load ZL 290, according to well known principles for tank circuits.

Still referring to FIG. 2, time variant analog signal 260 is converted into a representative bit stream by digitizer 240, the bit stream being then fed to pulse deletion logic 230 which produces a pulse deletion control signal 231 in the form of a binary data stream. The pulse deletion control signal 231 is gated using an AND (and) gate 232 with a signal from a low level (unamplified) source 220 of carrier signal 221. The resultant gated signal is fed to the control terminal 281 of the high-speed switching device 280. Taken together, the actions of on/off current switching synchronized to the input low level carrier signal with pulse deletion and the energy recovery waveform shaping, produce a high power output signal 212. The high power output signal 212 has an envelope modulation that contains information from the original analog input signal 260.

The energy recovery waveform shaping bandpass circuit 210 operates at high power, it can be constructed from low loss purely reactive devices. Low loss at high power is a necessary feature of a high-efficiency power amplifier. Another high power subsystem is the high-speed switch 280; as intimated above this device will have low loss and high efficiency to the extent it approximates a perfect switch. Such a switch exhibits near zero resistance in the "on" state and near zero conductance in the "off" state.

Figure 3A:
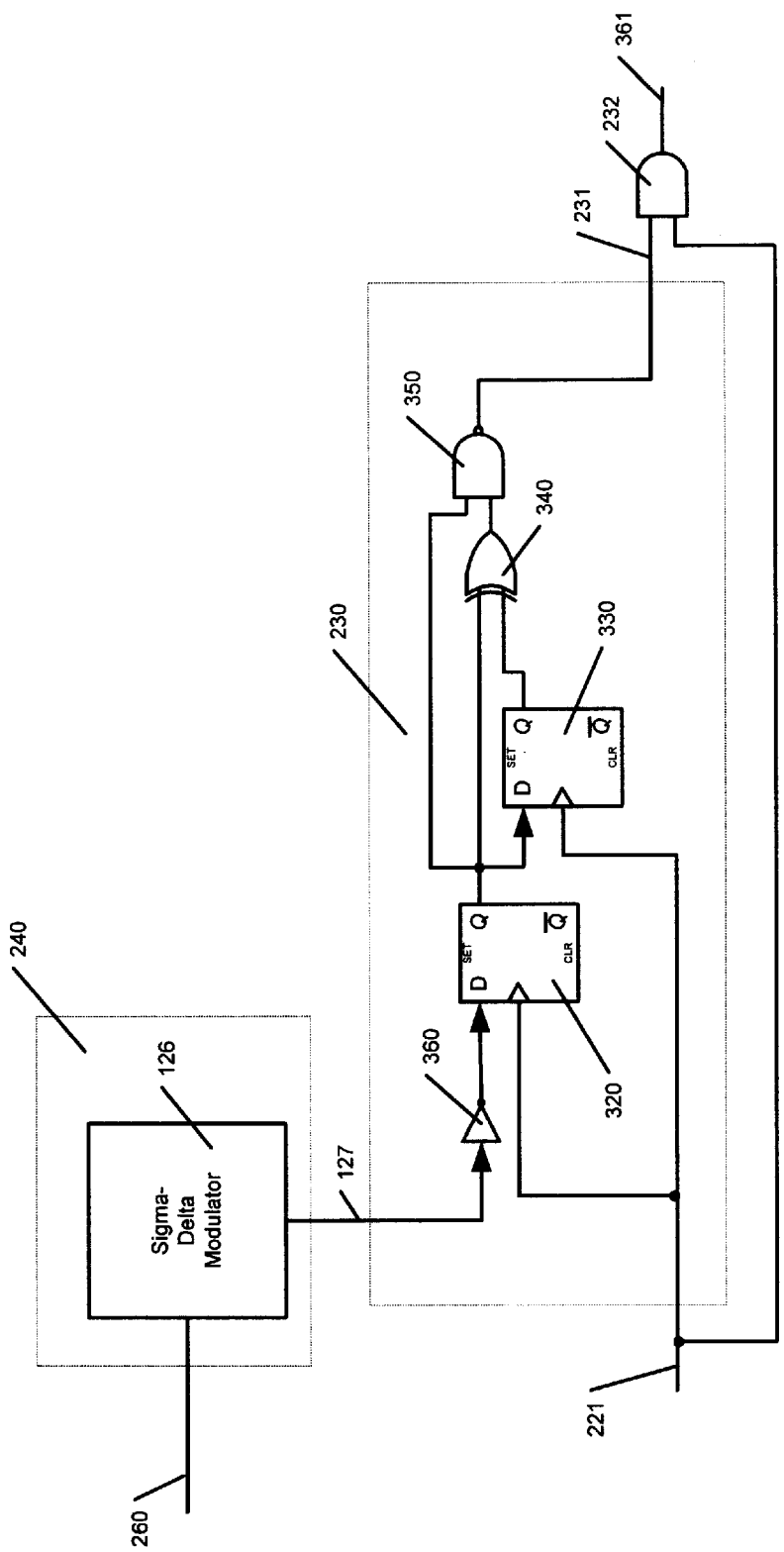
FIG. 3a shows a circuit block diagram of a digitizer and pulse deletion logic according to one particular embodiment of the invention.

FIG. 3a shows a circuit block diagram of a digitizer 240 and pulse deletion logic 230 according to one particular embodiment of the invention. Digitizer 240 comprises a Sigma-Delta modulator 126, which receives analog baseband signal 260. The output from Sigma-Delta modulator is a one bit wide "non-return to zero" (NRZ) bit stream 127 at sampling rate. The pulse deletion logic 230 receives NRZ bit stream 127 and low-level RF carrier signal 221. These signals are gated and clocked by inverter 360, flip-flops 320, 330, and by XOR (exclusive-or) gate 340, NAND (and-negate) gate 350 to produce pulse deletion control signal 231. Pulse deletion control signal 231 is gated by AND gate 232 with low level RF carrier 221 to produce RF signal 361 having missing (deleted) pulses. Alternatives to the use of a Sigma-Delta modulator may be, for example, a pulse code modulator or a straight delta modulator (with some loss of signal compatibility).

Figure 3B:
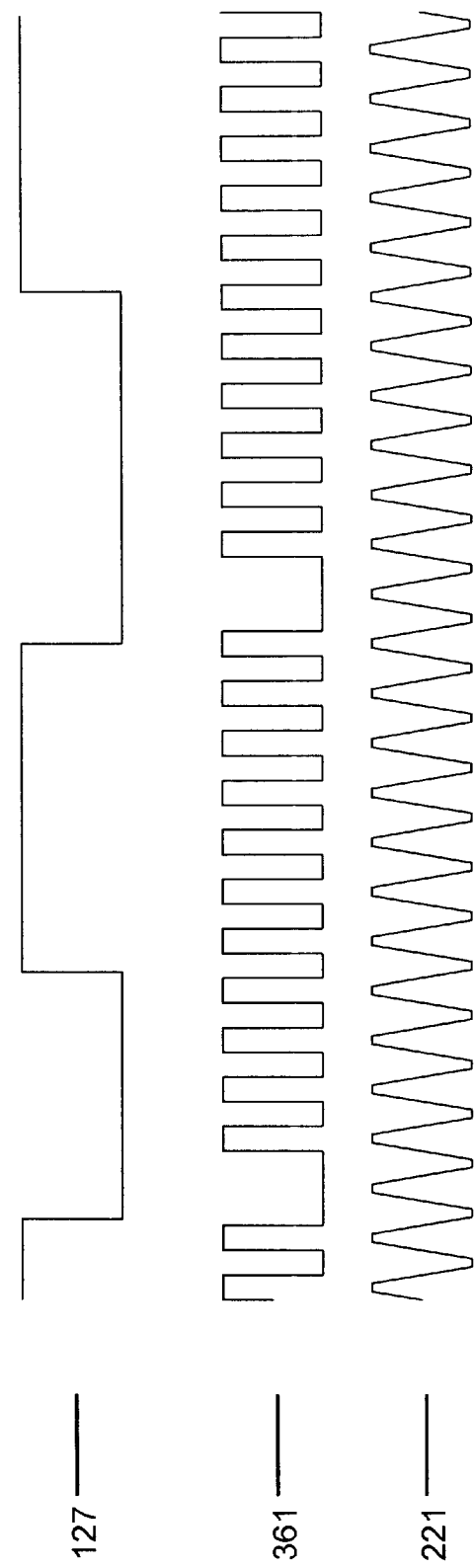

FIG. 3b shows waveforms of some of the signals present in the circuit depicted as FIG. 3a, low level RF carrier 221 is shown to be a distorted sine wave although the shape of the waveform is merely exemplary and is not critical. Still referring to FIG. 3b, the waveform of the bit stream 127 output from Sigma-Delta modulator is shown. Exemplary RF signal 361 having two missing (deleted) pulses is also shown in FIG. 3b.

Figure 4:
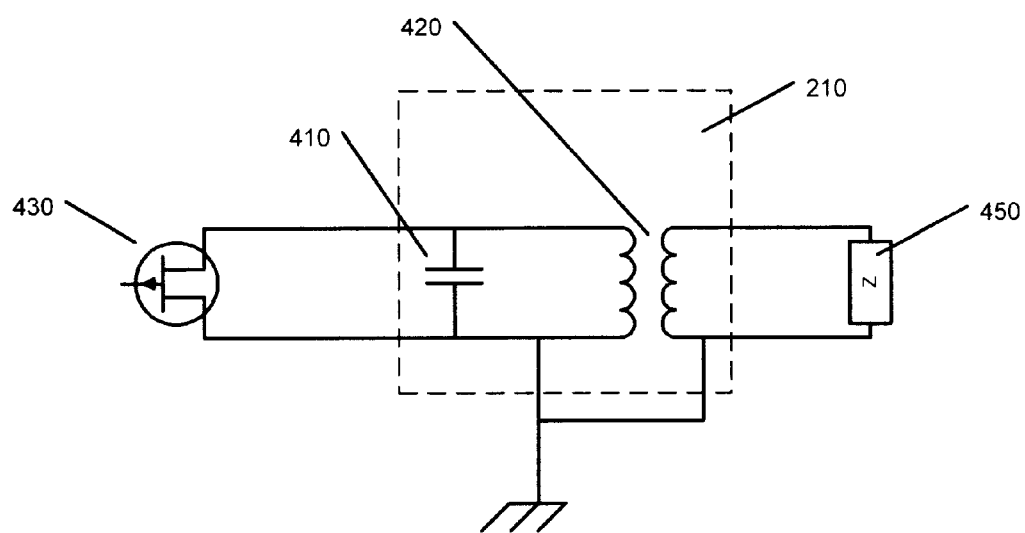
FIG. 4 shows an equivalent circuit of an exemplary embodiment of energy recovery waveform shaping circuit, switching device and load.

FIG. 4 shows an alternating current (AC) diagram of an exemplary embodiment of energy recovery waveform shaping circuit 210 and high power high speed switch 280 according to an embodiment of the invention. Energy recovery waveform shaping circuit 210 is a simple tank circuit with a high Q, comprising low loss capacitor 410 and low loss mutual inductance (transformer) 420 feeding a complex load 450. High power high-speed switch 280 is embodied as a junction field-effect transistor (JFET) 430. It can be seen that the parallel resonant circuit formed by capacitor 410 and self-inductance of transformer 420 is loaded by transformed load 450 and also any stray circuit parameters such as parasitic capacitance of JFET 430. Component values must be chosen with some care, but according to simple well-known principles for RF filters. Circulating currents in the inductance-capacitance tank drive the load and these are refreshed by the switching action of the JFET. Deleting a single pulse certainly impacts phase noise (jitter) effectively rotating the phase constellation of the carrier, assuming it is phase modulated. Happily, deleting pulses causes least phase distortion at moments of greatest amplitude and for a typical modulation constellation those are the very moments that phase information is most critical. Conversely, amplitude is minimal at the mid-point of some state transitions so that phase is most distorted when it matters least. Deleting a series of pulses introduces spurs (spurious out of band frequency components) into the output signal. Nonetheless, application of the invention provides substantially higher power efficiency for the same linearity (or equivalently the same out of band emission limits) as compared to other methods of envelope modulation/linear amplification using comparable components.

While the invention has been described above by reference to various embodiments, it will be understood that changes and modifications may be made without departing from the scope of the invention, which is to be defined only by the appended claims and their equivalent. For example, the invention is applicable to QPSK modems. Such and other variations are within the scope of the invention. All references referred to herein are incorporated by reference in their entireties.

What is claimed is:

1. A method for generating a signal, the method comprising:
   a. providing a carrier signal comprising pulses;
   b. providing a binary data stream that represents information;
   c. generating a first control signal from the carrier signal by excluding pulses selected in response to the binary data stream;
   d. providing a high speed switching device having a control terminal; and
   e. impressing the first control signal upon the control terminal of the high speed switching device to produce a higher powered signal;
   whereby an envelope modulated signal is generated.

2. The method of claim 1 further comprising:
   f. filtering the higher powered signal.

3. The method of claim 1 wherein:
   the binary data stream is created by a Sigma-Delta modulator.

4. The method of claim 1 wherein:
   the binary data stream is created by a Delta modulator.

5. The method of claim 1 wherein:
   the binary data stream is created by a pulse code modulator.

6. A method for generating a signal, the method comprising the steps of:
   a. step for providing a carrier signal comprising pulses;
   b. step for providing a binary data stream that represents information;
   c. step for generating a first control signal from the carrier signal by excluding pulses selected in response to the binary data stream;
   d. step for providing a high speed switching device having a control terminal; and
   e. step for impressing the first control signal upon the control terminal of the high speed switching device to produce a higher powered signal;
   whereby an envelope modulated signal is generated.

7. The method of claim 6 further comprising the step of:
   f. step for filtering the higher powered signal.

8. An apparatus for generating an envelope modulated signal comprising:
   a source of carrier signal;
   a source of a binary data stream;
   a pulse deletion logic for receiving the carrier signal and producing a control signal in response to the binary data stream; and
   a current switching device for generating an output signal in response to the control signal, the output signal having a greater amplitude than the carrier signal.

9. The apparatus of claim 8 further comprising:
   a filter for waveform shaping of the output signal.

10. The apparatus of claim 8 wherein:
    the source of a binary data stream is a Sigma-Delta modulator.

11. The apparatus of claim 8 wherein:
    the source of a binary data stream is a Delta modulator.

12. The apparatus of claim 8 wherein:
    the source of a binary data stream is a pulse code modulator.

13. An amplifying apparatus comprising:
    a demodulator for recovering a baseband signal from an envelope modulated signal;
    a digitizer for converting the baseband signal into a binary data stream;
    an envelope eliminator for recovering a carrier signal from the envelope modulated signal;
    a pulse deletion logic for receiving the carrier signal and producing a control signal in response to the binary data stream; and
    a current switching device for generating an output signal in response to the control signal, the output signal having a greater amplitude than the envelope modulated signal.

14. The amplifying apparatus of claim 13 further comprising:
    a filter for waveform shaping of the output signal.

15. The amplifying apparatus of claim 14 wherein:
    the digitizer is a Sigma-Delta modulator.

* * * * *